US012624286B2

(12) United States Patent
Harada et al.

(10) Patent No.: US 12,624,286 B2
(45) Date of Patent: May 12, 2026

(54) ETCHING COMPOSITION, ETCHING METHOD, METHOD FOR MANUFACTURING SEMICONDUCTOR DEVICE, AND METHOD FOR MANUFACTURING GATE-ALL-AROUND-TYPE TRANSISTOR

(71) Applicant: Mitsubishi Chemical Corporation, Tokyo (JP)

(72) Inventors: Ken Harada, Tokyo (JP); Tatsunobu Suzuki, Tokyo (JP); Mari Abe, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 57 days.

(21) Appl. No.: 18/219,267

(22) Filed: Jul. 7, 2023

(65) Prior Publication Data

US 2023/0374383 A1 Nov. 23, 2023

Related U.S. Application Data

(63) Continuation of application No. PCT/JP2021/041868, filed on Nov. 15, 2021.

(30) Foreign Application Priority Data

Jan. 12, 2021 (JP) ................................. 2021-002880

(51) Int. Cl.
*C09K 13/00* (2006.01)
*H01L 21/306* (2006.01)
*H01L 21/3213* (2006.01)

(52) U.S. Cl.
CPC ........ *C09K 13/00* (2013.01); *H01L 21/30604* (2013.01); *H01L 21/32134* (2013.01)

(58) Field of Classification Search
CPC .............. C09K 13/00; H01L 21/30604; H01L 21/32134
USPC ............................................... 252/79.1–79.5
See application file for complete search history.

(56) References Cited

U.S. PATENT DOCUMENTS

| | | | |
|---|---|---|---|
| 2017/0145311 A1 | 5/2017 | Liu et al. | |
| 2019/0085240 A1 | 3/2019 | Liu et al. | |
| 2019/0103282 A1 | 4/2019 | Ge et al. | |
| 2020/0027791 A1 | 1/2020 | Loubet et al. | |
| 2020/0216757 A1 | 7/2020 | Jeon et al. | |

FOREIGN PATENT DOCUMENTS

| | | |
|---|---|---|
| EP | 3351658 A1 | 7/2018 |
| EP | 3599634 A1 | 1/2020 |
| JP | 2019-50364 A | 3/2019 |
| TW | 201827648 A | 8/2018 |
| TW | 201920613 A | 6/2019 |
| TW | 201920765 A | 6/2019 |
| WO | 2015/103146 A1 | 7/2015 |
| WO | 2020/252272 A1 | 12/2020 |

OTHER PUBLICATIONS

International Search Report issued in related International Patent Application No. PCT/JP2021/041868 dated Dec. 21, 2021.
Extended European Search Report issued Jun. 25, 2024 for European Patent Application No. 21919549.2.
Office Action issued in corresponding Korean Patent Application No. 10-2023-7010664, dated Nov. 19, 2024.
Office Action issued in corresponding Japanese Patent Application No. 2022-575091 dated Oct. 7, 2025.
Office Action issued in corresponding Korean Patent Application No. 10-2023-7010664, dated Jun. 27, 2025.
Office Action issued in corresponding Taiwanese Patent Application No. 110147702, dated Jul. 7, 2025.
Office Action issued in corresponding Israeli Patent Application No. 304357, dated Dec. 25, 2025. (See the letter including English translation of the Office Action).
Office Action issued in corresponding Korean Patent Application No. 10-2023-7010664, dated Feb. 12, 2026.

*Primary Examiner* — Anita K Alanko
(74) *Attorney, Agent, or Firm* — Morgan, Lewis & Bockius LLP

(57) ABSTRACT

An etching composition that includes a quaternary ammonium salt having 8 or more carbon atoms and selectively dissolves silicon over silicon germanium, and may further include a chelating agent, an etching method comprising etching a structure that contains silicon and silicon germanium by using the etching composition, a method for manufacturing a semiconductor device, and a method for manufacturing a gate-all-around-type transistor using the etching composition.

14 Claims, No Drawings

ETCHING COMPOSITION, ETCHING METHOD, METHOD FOR MANUFACTURING SEMICONDUCTOR DEVICE, AND METHOD FOR MANUFACTURING GATE-ALL-AROUND-TYPE TRANSISTOR

TECHNICAL FIELD

The present invention relates to etching compositions, an etching method, a method for manufacturing a semiconductor device, and a method for manufacturing a gate-all-around-type transistor.

BACKGROUND ART

Integrated circuits are increasingly scaled down according to Moore's law.

In recent years, studies have been conducted to improve performance and advance further scaling-down and integration not only by reducing the size of the conventional planar transistors but also by modifying structures; examples of such modifications include fin-type transistors (fin-type FET) and gate-all-around-type transistors (GAA-type FET).

In fin-type FETs, fins are formed on a silicon substrate in a vertical direction. Accordingly, fin-type FETs have an increased number of transistors per unit area and, in addition, exhibit excellent performance in ON/OFF control at low voltage.

Further improving the performance would require an alteration, such as an increase in an aspect ratio of the fins. However, if the aspect ratio is excessively high, problems arise, such as a collapse of the fins in a cleaning process or a drying process used for the formation of the fins.

In GAA-type FETs, the performance of the transistors per unit area is improved by covering a nanosheet or a nanowire, which serves as a channel, with a gate electrode, thereby increasing an area of contact between the channel and the gate electrode.

The formation of GAA-type FETs requires an etching composition for selectively etching silicon or silicon germanium from a structure in which silicon and silicon germanium are alternately layered.

Patent Literature 1 discloses such an etching composition, which is a composition containing a quaternary ammonium hydroxide compound, specifically, ethyltrimethylammonium hydroxide.

PTL 1: JP 2019-050364 A

The etching composition disclosed in Patent Literature 1 is one in which the type of the quaternary ammonium hydroxide compound is not optimized, and a chelating agent is not included. For either of these reasons, it cannot be said that the etching composition has sufficient ability to selectively dissolve silicon over silicon germanium.

In the structure disclosed in Patent Literature 1 in which silicon and silicon germanium are alternately layered, the silicon used is polysilicon, which has low crystallinity. It is, therefore, unknown whether a comparable selective dissolution ability can be provided in the case of high-crystallinity silicon, which is used in actual semiconductor devices in many cases.

To date, etching compositions containing various components have been studied as in Patent Literature 1. Unfortunately, it cannot be said that those compositions have had sufficient ability to selectively dissolve silicon over silicon germanium.

SUMMARY OF INVENTION

An object of the present invention is to provide etching compositions that promote dissolution of silicon while inhibiting dissolution of silicon germanium and, therefore, have an enhanced ability to selectively dissolve silicon over silicon germanium.

Another object of the present invention is to provide an etching method, a method for manufacturing a semiconductor device, and a method for manufacturing a gate-all-around-type transistor; these methods use any of the etching compositions.

Solution to Problem

The inventors of the present invention found that the later-described etching compositions promote dissolution of silicon while inhibiting dissolution of silicon germanium and, therefore, have an enhanced ability to selectively dissolve silicon over silicon germanium.

Accordingly, the features of the present invention are as follows:

[1] An etching composition comprising a quaternary ammonium salt having 8 or more carbon atoms, wherein the etching composition selectively dissolves silicon over silicon germanium.

[2] The etching composition according to [1], wherein the quaternary ammonium salt having 8 or more carbon atoms contains at least one compound selected from the group consisting of tetraethylammonium hydroxide, tetrapropylammonium hydroxide, tetrabutylammonium hydroxide, tetrahexylammonium hydroxide, tetraoctylammonium hydroxide, and benzyltrimethylammonium hydroxide.

[3] The etching composition according to [1], wherein the quaternary ammonium salt having 8 or more carbon atoms contains at least one compound selected from the group consisting of tetraethylammonium hydroxide, tetrapropylammonium hydroxide, and tetrabutylammonium hydroxide.

[4] The etching composition according to [1], wherein the quaternary ammonium salt having 8 or more carbon atoms includes 50 mass % or more of a quaternary alkyl ammonium salt having four identical alkyl groups based on a total mass of the quaternary ammonium salt having 8 or more carbon atoms.

[5] The etching composition according to [1], wherein a content of the quaternary ammonium salt having 8 or more carbon atoms is greater than or equal to 10 mass % based on a total mass of the etching composition.

[6] The etching composition according to [1], further comprising a chelating agent.

[7] The etching composition according to [6], wherein a content of the chelating agent is 0.001 mass % to 25 mass % based on a total mass of the etching composition.

[8] The etching composition according to [6], wherein a mass ratio of the quaternary ammonium salt having 8 or more carbon atoms to the chelating agent is 5 to 5000.

[9] The etching composition according to [1], further comprising water.

[10] The etching composition according to [1], further comprising a water-miscible solvent.

[11] The etching composition according to [10], wherein a content of the water-miscible solvent is less than or equal to 15 mass % based on a total mass of the etching composition.

[12] The etching composition according to [10], wherein a mass ratio of the quaternary ammonium salt having 8 or more carbon atoms to the water-miscible solvent is greater than or equal to 1.

[13] An etching composition comprising a quaternary ammonium salt having 8 or more carbon atoms, wherein the quaternary ammonium salt having 8 or more carbon atoms contains at least one compound selected from the group consisting of tetraethylammonium hydroxide, tetrapropylammonium hydroxide, and tetrabutylammonium hydroxide, the quaternary ammonium salt having 8 or more carbon atoms includes 50 mass % or more of a quaternary alkyl ammonium salt having four identical alkyl groups based on a total mass of the quaternary ammonium salt having 8 or more carbon atoms, and a content of the quaternary ammonium salt having 8 or more carbon atoms is greater than or equal to 10 mass % based on a total mass of the composition.

[14] An etching method comprising etching a structure that contains silicon and silicon germanium by using the etching composition according to [1].

[15] A method for manufacturing a semiconductor device comprising etching a structure containing silicon and silicon germanium by using the etching composition according to [1].

[16] A method for manufacturing a gate-all-around-type transistor comprising etching a structure containing silicon and silicon germanium by using the etching composition according to [1].

Advantageous Effects of Invention

The etching composition of the present invention promotes dissolution of silicon while inhibiting dissolution of silicon germanium and, therefore, has an enhanced ability to selectively dissolve silicon over silicon germanium.

The etching method of the present invention, the method of the present invention for manufacturing a semiconductor device, and the method of the present invention for manufacturing a gate-all-around-type transistor use an etching composition of the present invention. Accordingly, in the etching steps, these methods promote dissolution of silicon while inhibiting dissolution of silicon germanium and, therefore, provide an enhanced ability to selectively dissolve silicon over silicon germanium; consequently, the methods enable high-precision etching to be carried out, thereby enabling high-yield manufacture of desired products.

DESCRIPTION OF EMBODIMENTS

The present invention will be described in detail below. The present invention is not limited to the embodiments described below and can be practiced with various modifications within the scope of the present invention. In this specification, when numerical ranges are expressed with the term "to", it should be understood that the preceding and following numerical values or physical property values are inclusive.

An etching composition of the present invention includes a quaternary ammonium salt (A) having 8 or more carbon atoms (hereinafter also referred to as a "component (A)"). Consequently, the etching composition can selectively dissolve silicon over silicon germanium.

In addition, the etching composition of the present invention may include a chelating agent (B) (hereinafter also referred to as a "component (B)"), water (C) (hereinafter also referred to as a "component (C)"), and a water-miscible solvent (D) (hereinafter also referred to as a "component (D)").

<Component (A)>

The component (A) is a quaternary ammonium salt having 8 or more carbon atoms. The inclusion of a quaternary ammonium salt having 8 or more carbon atoms in the etching composition provides the effect of dissolving silicon or silicon germanium.

The number of carbon atoms of the component (A) may be 8 to 32, which is preferable in terms of providing an enhanced ability to selectively dissolve silicon over silicon germanium. More preferably, the number may be 12 to 24. Examples of the quaternary ammonium salt having 8 or more carbon atoms that serves as the component (A) include quaternary alkyl ammonium salts, such as tetraalkylammonium hydroxides in which one or more of the alkyl groups are optionally substituted, examples of which include tetraethylammonium hydroxide, tetrapropylammonium hydroxide, tetrabutylammonium hydroxide, tetrahexylammonium hydroxide, tetraoctylammonium hydroxide, and benzyltrimethylammonium hydroxide.

Regarding the quaternary alkyl ammonium salt that serves as the component (A), the four alkyl groups may be identical, which is preferable in terms of providing an enhanced ability to selectively dissolve silicon over silicon germanium; in particular, a quaternary alkyl ammonium salt having four identical alkyl groups may be present preferably in an amount greater than or equal to 50 mass %, more preferably in an amount greater than or equal to 70 mass %, and even more preferably in an amount greater than or equal to 90 mass %, based on the total mass of the component (A), and most preferably, the quaternary alkyl ammonium salt having four identical alkyl groups may be present in an amount of 100 mass %.

The quaternary ammonium salts having 8 or more carbon atoms may be used alone or in a combination of two or more.

Among the quaternary ammonium salts having 8 or more carbon atoms, tetraethylammonium hydroxide, tetrapropylammonium hydroxide, tetrabutylammonium hydroxide, tetrahexylammonium hydroxide, tetraoctylammonium hydroxide, and benzyltrimethylammonium hydroxide are preferable in terms of providing an enhanced ability to selectively dissolve silicon over silicon germanium; tetraethylammonium hydroxide, tetrapropylammonium hydroxide, tetrabutylammonium hydroxide, and benzyltrimethylammonium hydroxide are more preferable; tetraethylammonium hydroxide, tetrapropylammonium hydroxide, and tetrabutylammonium hydroxide are even more preferable; and tetrabutylammonium hydroxide is most preferable.

A content of the component (A) may be greater than or equal to 1 mass % based on the total mass of the etching composition, which is preferable in terms of providing an enhanced ability to selectively dissolve silicon. More preferably, the content may be greater than or equal to 10 mass %, and even more preferably, greater than or equal to 15 mass %.

The content of the component (A) may be less than or equal to 70 mass % based on the total mass of the etching composition, which is preferable in terms of providing an enhanced ability to selectively dissolve silicon. More preferably, the content may be less than or equal to 55 mass %, and even more preferably, less than or equal to 40 mass %.

Based on the above-mentioned preferred forms of the component (A), an etching composition of the present invention may be an etching composition including the component (A) and in which the component (A) contains at least one compound selected from the group consisting of tetrapropylammonium hydroxide and tetrabutylammonium hydroxide; in the component (A), the content of a quaternary alkyl ammonium salt having four identical alkyl groups is greater than or equal to 50 mass % based on the total mass of the component (A); and the content of the component (A) is greater than or equal to 10 mass % based on the total mass of the composition.

<Component (B)>

The component (B) is a chelating agent. The inclusion of a chelating agent in the etching composition provides the effect of protecting silicon germanium.

Examples of the chelating agent include amine compounds, amino acids, and organic acids. These chelating agents may be used alone or in a combination of two or more. Among these chelating agents, amine compounds, amino acids, and organic acids are preferable in terms of providing an enhanced ability to selectively dissolve silicon over silicon germanium; amine compounds are more preferable.

Examples of the amine compounds include ethylenediamine, 1,3-diaminopropane, 1,4-diaminobutane, ethylenediamine tetraacetic acid, diethylenetriamine pentaacetic acid, triethylenetetramine hexaacetic acid, diethylenetriaminepentakis(methylphosphonic acid), ethylenediamine-N,N'-bis[2-(2-hydroxyphenyl)acetic acid], N,N'-bis(3-aminopropane) ethylenediamine, N-methyl-1,3-diaminopropane, 2-aminoethanol, N-methyl diethanolamine, and 2-amino-2-methyl-1-propanol. These amine compounds may be used alone or in a combination of two or more.

Among these amine compounds, ethylenediamine, 1,3-diaminopropane, 1,4-diaminobutane, ethylenediamine tetraacetic acid, diethylenetriamine pentaacetic acid, triethylenetetramine hexaacetic acid, diethylenetriaminepentakis (methylphosphonic acid), ethylenediamine-N,N'-bis[2-(2-hydroxyphenyl)acetic acid], N,N'-bis(3-aminopropane) ethylenediamine, N-methyl-1,3-diaminopropane, 2-aminoethanol, N-methyl diethanolamine, and 2-amino-2-methyl-1-propanol are preferable in terms of providing an enhanced ability to selectively dissolve silicon over silicon germanium; ethylenediamine, 1,3-diaminopropane, 1,4-diaminobutane, ethylenediamine tetraacetic acid, diethylenetriamine pentaacetic acid, triethylenetetramine hexaacetic acid, diethylenetriaminepentakis(methylphosphonic acid), and ethylenediamine-N,N'-bis[2-(2-hydroxyphenyl)acetic acid] are more preferable.

Examples of the amino acids include glycine, arginine, histidine, and (2-dihydroxyethyl)glycine. These amino acids may be used alone or in a combination of two or more.

Among these amino acids, glycine, arginine, histidine, and (2-dihydroxyethyl)glycine are preferable in terms of providing an enhanced ability to selectively dissolve silicon over silicon germanium; (2-dihydroxyethyl)glycine is more preferable.

Examples of the organic acids include oxalic acid, citric acid, tartaric acid, malic acid, and 2-phosphonobutane-1,2,4-tricarboxylic acid. These organic acids may be used alone or in a combination of two or more.

Among these organic acids, oxalic acid, citric acid, tartaric acid, malic acid, and 2-phosphonobutane-1,2,4-tricarboxylic acid are preferable in terms of providing an enhanced ability to selectively dissolve silicon over silicon germanium; citric acid and 2-phosphonobutane-1,2,4-tricarboxylic acid are more preferable.

A content of the component (B) may be greater than or equal to 0.001 mass % based on the total mass of the etching composition, which is preferable in terms of providing an enhanced ability to selectively dissolve silicon over silicon germanium. More preferably, the content may be greater than or equal to 0.005 mass %, and even more preferably, greater than or equal to 0.01 mass %.

The content of the component (B) may be less than or equal to 25 mass % based on the total mass of the etching composition, which is preferable in terms of providing an enhanced ability to selectively dissolve silicon over silicon germanium. More preferably, the content may be less than or equal to 10 mass %, and even more preferably, less than or equal to 6 mass %.

<Component (C)>

It is preferable that the etching composition of the present invention includes water (C) (component (C)), in addition to the component (A) and the component (B).

A content of the component (C) may be greater than or equal to 25 mass % based on the total mass of the etching composition, which is preferable in terms of simplifying the production of the etching composition. More preferably, the content may be greater than or equal to 40 mass %, and even more preferably, greater than or equal to 55 mass %.

The content of the component (C) may be less than or equal to 90 mass % based on the total mass of the etching composition, which is preferable in terms of improving an etching rate. More preferably, the content may be less than or equal to 85 mass %, and even more preferably, less than or equal to 75 mass %.

<Component (D)>

It is preferable that the etching composition of the present invention includes a water-miscible solvent (D) (component (D)), in addition to the component (A) and the component (B). The inclusion of a water-miscible solvent in an etchant provides the effect of protecting silicon germanium.

The water-miscible solvent (D) can be any solvent that is highly soluble in water. Preferably, the water-miscible solvent (D) is a solvent having a solubility parameter (SP value) of greater than or equal to 7.0.

Examples of the water-miscible solvent that serves as the component (D) include polar protic solvents, such as isopropanol, ethylene glycol, propylene glycol, methanol, ethanol, propanol, butanol, glycerol, and 2-(2-aminoethoxy) ethanol; polar aprotic solvents, such as acetone, dimethyl sulfoxide, N,N-dimethylformamide, N-methylpyrrolidone, and acetonitrile; and nonpolar solvents, such as hexane, benzene, toluene, and diethyl ether. These water-miscible solvents may be used alone or in a combination of two or more. Among these water-miscible solvents, glycerol, 2-(2-aminoethoxy)ethanol, ethylene glycol, and propylene glycol are preferable in terms of providing an enhanced ability to selectively dissolve silicon over silicon germanium.

In instances where the etching composition of the present invention includes the component (D), a content of the component (D) may be greater than or equal to 0.01 mass % based on the total mass of the etching composition, which is preferable in terms of providing an enhanced ability to selectively dissolve silicon over silicon germanium. More preferably, the content may be greater than or equal to 0.1 mass %, and even more preferably, greater than or equal to 1 mass %.

The content of the component (D) may be less than or equal to 30 mass % based on the total mass of the etching composition, which is preferable in terms of providing an enhanced ability to selectively dissolve silicon over silicon germanium. More preferably, the content may be less than or equal to 20 mass %, and even more preferably, less than or equal to 15 mass %.

<Other Components>

The etching composition of the present invention may include one or more other components that are different from the component (A), the component (B), the component (C), and the component (D).

Examples of the other components include surfactants, such as anionic surfactants, nonionic surfactants, and cationic surfactants; water-soluble polymers, such as polyvinyl alcohol, polyethylene glycol, polypropylene glycol, polyethyleneimine, polypropyleneimine, and polyacrylic acid; oxidizing agents, such as hydrogen peroxide, perchloric acid, and periodic acid; and reducing agents, such as ascorbic acid, gallic acid, pyrogallol, pyrocatechol, resorcinol, hydroquinone, and 8-hydroxyquinoline. These other components may be used alone or in a combination of two or more.

<Mass Ratio of Each Component>

In instances where the etching composition of the present invention includes the component (A) and the component (B), a mass ratio of the component (A) to the component (B) in the etching composition of the present invention (mass of component (A)/mass of component (B), hereinafter referred to as "(A)/(B)") may be 5 to 5000, which is preferable in terms of providing an enhanced ability to selectively dissolve silicon over silicon germanium. More preferably, the mass ratio may be 5 to 3000, and even more preferably, 10 to 3000.

In instances where the etchant of the present invention includes the component (D), a mass ratio of the component (A) to the component (D) (mass of component (A)/mass of component (D), hereinafter referred to as "(A)/(D)") may be 0.01 to 1000, which is preferable in terms of providing an enhanced ability to selectively dissolve silicon over silicon germanium. More preferably, the mass ratio may be 0.1 to 100.

In instances where the etchant of the present invention includes the component (D), a mass ratio of the component (B) to the component (D) (mass of component (B)/mass of component (D), hereinafter referred to as "(B)/(D)") may be 2 to 2000, which is preferable in terms of providing an enhanced ability to selectively dissolve silicon over silicon germanium. More preferably, the mass ratio may be 5 to 1000.

<Method for Producing Etching Composition>

Methods for producing the etching composition of the present invention are not particularly limited. The etching composition can be produced by mixing the component (A) with the component (B), the component (C), the component (D), and other components, as necessary.

The order of the mixing is not particularly limited. All the components may be mixed together at one time, or some of the components are first mixed together, and subsequently, the other components may be mixed therewith.

<Physical Properties of Etching Composition>

The etching composition of the present invention may have an etch rate for silicon, $ER_{Si}$, of greater than or equal to 1 nm/minute, which is preferable in terms of providing an enhanced ability to selectively dissolve silicon over silicon germanium. More preferably, the etch rate $ER_{Si}$ may be greater than or equal to 3 nm/minute.

The etching composition of the present invention may have an etch rate for silicon germanium, $ER_{Si}Ge$, of less than or equal to 1 nm/minute, which is preferable in terms of providing an enhanced ability to selectively dissolve silicon over silicon germanium. More preferably, the etch rate $ER_{Si}Ge$ may be less than or equal to 0.8 nm/minute, and even more preferably, less than or equal to 0.5 nm/minute.

The etching composition of the present invention may have a dissolution selectivity for silicon germanium and silicon ($ER_{Si}/ER_{SiGe}$) of greater than or equal to 4, which is preferable in terms of providing an enhanced ability to selectively dissolve silicon over silicon germanium. More preferably, the dissolution selectivity may be greater than or equal to 10.

The etch rate $ER_{Si}$, the etch rate $ER_{Si}Ge$, and the dissolution selectivity are measured and calculated with the methods described in the Examples section, provided later herein.

<Object to be Etched by Etching Composition>

The etching composition of the present invention promotes dissolution of silicon while inhibiting dissolution of silicon germanium and, therefore, has an enhanced ability to selectively dissolve silicon over silicon germanium. Accordingly, suitable examples of objects to be etched by the etching composition of the present invention include structures containing silicon and silicon germanium, such as semiconductor devices, and particularly suitable examples include structures in which silicon and silicon germanium are alternately layered, which are necessary for the formation of GAA-type FETs.

A content of the silicon in the silicon germanium that is an object to be etched may be greater than or equal to 10 mass % based on the total mass of the silicon germanium, which is preferable because such a content is suitable for the etching performed with the etching composition of the present invention. More preferably, the content may be greater than or equal to 20 mass %.

The content of the silicon in the silicon germanium may be less than or equal to 95 mass % based on the total mass of the silicon germanium, which is preferable because such a content is suitable for the etching performed with the etching composition of the present invention. More preferably, the content may be less than or equal to 85 mass %.

Furthermore, a content of the germanium in the silicon germanium may be greater than or equal to 5 mass % based on the total mass of the silicon germanium, which is preferable because such a content is suitable for the etching performed with the etching composition of the present invention. More preferably, the content may be greater than or equal to 15 mass %.

The content of the germanium in the silicon germanium may be less than or equal to 90 mass % based on the total mass of the silicon germanium, which is preferable because such a content is suitable for the etching performed with the etching composition of the present invention. More preferably, the content may be less than or equal to 80 mass %.

An alloy film of the silicon germanium may be produced by performing film formation with a known method. The alloy film may be produced by performing film deposition with a crystal growth method, which is preferable because, in such a case, an enhanced mobility of electrons and holes is exhibited after the formation of transistors.

The structure containing silicon and silicon germanium and the structure in which silicon and silicon germanium are alternately layered may have one or more portions in which silicon oxide, silicon nitride, silicon carbonitride, and/or the like are exposed.

Furthermore, another etching composition of the present invention is one including the component (A) and in which the component (A) contains at least one compound selected from the group consisting of tetraethylammonium hydroxide, tetrapropylammonium hydroxide, and tetrabutylammonium hydroxide; in the component (A), the content of a quaternary alkyl ammonium salt having four identical alkyl groups is greater than or equal to 50 mass % based on the total mass of the component (A); and the content of the component (A) is greater than or equal to 10 mass % based on the total mass of the composition. This etching composition has an enhanced ability to selectively dissolve silicon over silicon germanium and, therefore, can be suitably used in structures containing silicon and silicon germanium.

<Etching Method>

An etching method of the present invention is a method for etching a structure that contains silicon and silicon germanium, by using an etching composition of the present invention.

The process of the etching may be a known process, which may be, for example, a batch process, a single-wafer process, or the like.

It is preferable that a temperature during the etching be greater than or equal to 15° C., because, in this case, the etch rate can be improved. The temperature is more preferably greater than or equal to 20° C.

From the standpoint of a reduction in damage to a substrate and the stability of etching, it is preferable that the temperature during the etching be less than or equal to 100° C. More preferably, the temperature is less than or equal to 80° C.

As referred to herein, the temperature during the etching is a temperature of the etching composition during the etching.

<Uses>

The etching compositions of the present invention and the etching method of the present invention can be suitably used in the manufacture of semiconductor devices that involves a step of etching a structure that contains silicon and silicon germanium. The etching compositions and the etching method promote dissolution of silicon while inhibiting dissolution of silicon germanium and, therefore, have an enhanced ability to selectively dissolve silicon over silicon germanium. Accordingly, the etching compositions of the present invention and the etching method of the present invention can be particularly suitably used in the manufacture of GAA-type FETs that involves a step of etching a structure containing silicon and silicon germanium.

EXAMPLES

The present invention will now be described in more detail with reference to examples. The present invention is not limited to the description of the examples below as long as the scope thereof remains unchanged.

<Raw Materials>

In Examples and Comparative Examples, described below, the following raw materials were used for the production of etching compositions.

Component (A-1): tetrabutylammonium hydroxide
Component (A-2): tetrapropylammonium hydroxide
Component (A'-1): ammonia
Component (A'-2): tetramethylammonium hydroxide
Component (A'-3): ethyltrimethylammonium hydroxide
Component (B-1): ethylenediamine
Component (B-2): 1,3-diaminopropane
Component (B-3): ethylenediamine tetraacetic acid
Component (B-4): diethylenetriamine pentaacetic acid
Component (B-5): diethylenetriaminepentakis(methylphosphonic acid)

Component (B-6): ethylenediamine-N,N'-bis[2-(2-hydroxyphenyl)acetic acid]
Component (B-7): N,N'-bis(3-aminopropane) ethylenediamine
Component (B-8): N-methyl-1,3-diaminopropane
Component (B-9): 2-phosphonobutane-1,2,4-tricarboxylic acid
Component (B-10): 2-aminoethanol
Component (B-11): N-methyl diethanolamine
Component (B-12): 2-amino-2-methyl-1-propanol
Component (C-1): water
Component (D-1): glycerol
Component (D-2): 2-(2-aminoethoxy)ethanol
Other components: 8-hydroxyquinoline (denoted as "(E-1)" in Table 1)

<Etch Rate for Silicon>

A substrate was immersed in a 0.5 mass % aqueous hydrofluoric acid solution for 30 seconds. The substrate included a structure in which silicon germanium having a film thickness of 10 nm and silicon having a film thickness of 10 nm (width of the silicon layer before immersion=10 nm) were layered. Subsequently, the substrate was rinsed with ultrapure water, and subsequently, the substrate was immersed in the etching compositions obtained in the Examples and the Comparative Examples, at 40° C. for 15 minutes. After the immersion, a cross section of the substrate was examined with an electron microscope to measure the width (nm) of the silicon layer, and the etch rate for silicon $ER_{Si}$ [nm/minute] was calculated according to equation (1) below.

$$ER_{Si} \text{ [nm/minute]}=(\text{width of silicon layer before immersion}-\text{width of silicon layer after immersion})\div15 \text{ minutes} \quad (1)$$

<Etch Rate for Silicon Germanium>

A substrate was immersed in a 0.5 mass % aqueous hydrofluoric acid solution for 30 seconds. The substrate included a structure in which silicon germanium having a film thickness of 10 nm (width of the silicon germanium layer before immersion=10 nm) and silicon having a film thickness of 10 nm were layered. Subsequently, the substrate was rinsed with ultrapure water, and subsequently, the substrate was immersed in the etching compositions obtained in the Examples and the Comparative Examples, at 40° C. for 15 minutes. After the immersion, a cross section of the substrate was examined with an electron microscope to measure the width (nm) of the silicon germanium layer, and the etch rate for the silicon germanium layer $ER_{SiGe}$ [nm/minute] was calculated according to equation (2) below.

$$ER_{SiGe} \text{ [nm/minute]}=(\text{width of silicon germanium layer before immersion}-\text{width of silicon germanium layer after immersion})\div15 \text{ minutes} \quad (2)$$

<Dissolution Selectivity for Silicon and Silicon Germanium>

The dissolution selectivity for silicon germanium and silicon was calculated according to equation (3) below.

$$\text{Dissolution selectivity}=ER_{Si} \text{ [nm/minute]}\div ER_{SiGe} \text{ [nm/minute]} \quad (3)$$

Example 1

An etching composition was prepared by mixing components together such that the component (A-1) was present in an amount of 26 mass %, and the component (B-1) was present in an amount of 0.01 mass %, with the balance being the component (C-1), based on the total mass of the etching composition.

11

The results of evaluation of the prepared etching composition are shown in Table 1.

Examples 2 to 22 and Comparative Examples 1 to 8

Etching compositions were prepared by performing operations as in Example 1, except that the types and contents of the raw materials employed were as shown in Table 1, with the balance being the component (C-1).

The results of evaluation of the prepared etching compositions are shown in Table 1.

12

Although the present invention has been described in detail with reference to particular embodiments, it will be apparent to those skilled in the art that various changes can be made without departing from the spirit and the scope of the present invention.

The present application is based on Japanese Patent Application No. 2021-002880 filed on Jan. 12, 2021, which is herein incorporated in its entirety by reference.

INDUSTRIAL APPLICABILITY

The etching compositions of the present invention and the etching method of the present invention, which uses any of

TABLE 1

| | Component (A) | | Component (B) | | Component (D) | | Other components | | $ER_{Si}$ [nm/min] | $ER_{SiGe}$ [nm/min] | Dissolution Selectivity |
|---|---|---|---|---|---|---|---|---|---|---|---|
| | Type | Content [mass %] | Type | Content [mass %] | Type | Content [mass %] | Type | Content [mass %] | | | |
| Example 1 | (A-1) | 26.00 | (B-1) | 0.01 | — | — | — | — | 3.4 | 0.3 | 12.8 |
| Example 2 | (A-1) | 26.00 | (B-2) | 0.01 | — | — | — | — | 3.8 | 0.3 | 14.3 |
| Example 3 | (A-1) | 26.00 | (B-3) | 0.10 | — | — | — | — | 3.4 | 0.2 | 17.0 |
| Example 4 | (A-1) | 26.00 | (B-4) | 0.10 | — | — | — | — | 3.3 | <0.07 | >49.0 |
| Example 5 | (A-1) | 26.00 | (B-5) | 0.01 | — | — | — | — | 4.1 | 0.3 | 12.2 |
| Example 6 | (A-1) | 26.00 | (B-6) | 0.01 | — | — | — | — | 4.7 | 0.4 | 11.8 |
| Example 7 | (A-1) | 26.00 | (B-7) | 0.10 | — | — | — | — | 3.6 | 0.3 | 13.5 |
| Example 8 | (A-1) | 26.00 | (B-8) | 0.10 | — | — | — | — | 3.3 | 0.1 | 25.0 |
| Example 9 | (A-1) | 26.00 | (B-9) | 0.01 | — | — | — | — | 2.9 | 0.1 | 22.0 |
| Example 10 | (A-1) | 26.00 | (B-10) | 0.01 | — | — | — | — | 3.9 | 0.3 | 11.8 |
| Example 11 | (A-1) | 26.00 | (B-11) | 0.01 | — | — | — | — | 4.0 | 0.3 | 12.0 |
| Example 12 | (A-1) | 26.00 | (B-12) | 0.01 | — | — | — | — | 3.3 | 0.2 | 16.3 |
| Example 13 | (A-1) | 26.00 | — | — | — | — | — | — | 4.3 | 0.5 | 8.0 |
| Example 14 | (A-1) | 5.00 | — | — | — | — | — | — | 3.3 | 0.5 | 6.3 |
| Example 15 | (A-1) | 26.00 | (B-2) | 10.00 | — | — | — | — | 4.3 | 0.5 | 8.1 |
| Example 16 | (A-1) | 15.00 | — | — | (D-1) | 10.00 | — | — | 4.4 | 0.5 | 8.3 |
| Example 17 | (A-1) | 15.00 | — | — | (D-1) | 15.00 | — | — | 2.9 | 0.9 | 3.4 |
| Example 18 | (A-1) | 15.00 | — | — | — | — | — | — | 4.4 | 0.2 | 22.0 |
| Example 19 | (A-1) | 15.00 | (B-3) | 0.01 | — | — | — | — | 4.8 | 0.5 | 9.0 |
| Example 20 | (A-2) | 22.70 | — | — | — | — | — | — | 6.6 | 0.8 | 7.9 |
| Example 21 | (A-2) | 15.00 | — | — | — | — | — | — | 8.5 | 1.0 | 8.5 |
| Example 22 | (A-2) | 5.00 | — | — | — | — | — | — | 7.6 | 1.3 | 5.7 |
| Comparative Example 1 | (A'-1) | 10.00 | — | — | — | — | — | — | 0.9 | 0.1 | 7.0 |
| Comparative Example 2 | (A'-1) | 10.00 | (B-3) | 0.01 | — | — | — | — | 1.0 | 0.2 | 5.0 |
| Comparative Example 3 | (A'-2) | 15.00 | — | — | — | — | — | — | 4.1 | 3.4 | 1.2 |
| Comparative Example 4 | (A'-2) | 15.00 | (B-3) | 0.01 | — | — | — | — | 3.3 | 2.3 | 1.4 |
| Comparative Example 5 | (A'-3) | 15.00 | — | — | — | — | — | — | 4.4 | 3.3 | 1.3 |
| Comparative Example 6 | (A'-3) | 15.00 | (B-3) | 0.01 | — | — | — | — | 4.8 | 3.2 | 1.5 |
| Comparative Example 7 | (A'-3) | 15.00 | — | — | (D-1) | 10.00 | — | — | 3.7 | 2.4 | 1.5 |
| Comparative Example 8 | (A'-3) | 5.00 | — | — | (D-1) (D-2) | 20.00 35.00 | (E-1) | 1.00 | 1.3 | 0.2 | 6.3 |

As can be seen from Table 1, the etching compositions prepared in Examples 1 to 22 promoted dissolution of silicon while inhibiting dissolution of silicon germanium and, therefore, had an enhanced ability to selectively dissolve silicon over silicon germanium.

On the other hand, the etching compositions prepared in Comparative Examples 3 to 7, among Comparative Examples 1 to 8, in which the type of the component (A) was different from those of the present invention, had a poor ability to selectively dissolve silicon over silicon germanium, with dissolution of silicon germanium being promoted.

In Comparative Examples 1, 2, and 8, the ability to selectively dissolve silicon over silicon germanium was relatively good, but the ability to dissolve silicon was poor.

the etching compositions, promote dissolution of silicon while inhibiting dissolution of silicon germanium and, therefore, have an enhanced ability to selectively dissolve silicon over silicon germanium. Accordingly, the etching compositions of the present invention and the etching method of the present invention, which uses any of the etching compositions, can be suitably used in the manufacture of semiconductor devices and, in particular, can be suitably used in the manufacture of GAA-type FETs.

The invention claimed is:

1. An etching composition comprising
a quaternary ammonium salt having 8 or more carbon atoms and
a water-miscible solvent, wherein a mass ratio of the quaternary ammonium salt having 8 or more carbon atoms to the water-miscible solvent is greater than or equal to 1, and the etching composition selectively dissolves silicon over silicon germanium.

2. The etching composition according to claim 1, wherein the quaternary ammonium salt having 8 or more carbon atoms contains at least one compound selected from the group consisting of tetraethylammonium hydroxide, tetrapropylammonium hydroxide, tetrabutylammonium hydroxide, tetrahexylammonium hydroxide, tetraoctylammonium hydroxide, and benzyltrimethylammonium hydroxide.

3. The etching composition according to claim 1, wherein the quaternary ammonium salt having 8 or more carbon atoms contains at least one compound selected from the group consisting of tetraethylammonium hydroxide, tetrapropylammonium hydroxide, and tetrabutylammonium hydroxide.

4. The etching composition according to claim 1, wherein the quaternary ammonium salt having 8 or more carbon atoms includes 50 mass % or more of a quaternary alkyl ammonium salt having four identical alkyl groups based on a total mass of the quaternary ammonium salt having 8 or more carbon atoms.

5. The etching composition according to claim 1, wherein a content of the quaternary ammonium salt having 8 or more carbon atoms is greater than or equal to 10 mass % based on a total mass of the etching composition.

6. The etching composition according to claim 1, further comprising a chelating agent.

7. The etching composition according to claim 6, wherein a content of the chelating agent is 0.001 mass % to 25 mass % based on a total mass of the etching composition.

8. The etching composition according to claim 6, wherein a mass ratio of the quaternary ammonium salt having 8 or more carbon atoms to the chelating agent is 5 to 5000.

9. The etching composition according to claim 1, further comprising water.

10. The etching composition according to claim 1, wherein a content of the water-miscible solvent is less than or equal to 15 mass % based on a total mass of the etching composition.

11. An etching composition comprising a quaternary ammonium salt having 8 or more carbon atoms and a water-miscible solvent, wherein the quaternary ammonium salt having 8 or more carbon atoms contains at least one compound selected from the group consisting of tetraethylammonium hydroxide, tetrapropylammonium hydroxide, and tetrabutylammonium hydroxide, the quaternary ammonium salt having 8 or more carbon atoms includes 50 mass % or more of a quaternary alkyl ammonium salt having four identical alkyl groups based on a total mass of the quaternary ammonium salt having 8 or more carbon atoms, and a content of the quaternary ammonium salt having 8 or more carbon atoms is greater than or equal to 10 mass % based on a total mass of the composition, wherein a mass ratio of the quaternary ammonium salt having 8 or more carbon atoms to the water-miscible solvent is greater than or equal to 1.

12. An etching method comprising etching a structure that contains silicon and silicon germanium by using the etching composition according to claim 1.

13. A method for manufacturing a semiconductor device comprising etching a structure containing silicon and silicon germanium by using the etching composition according to claim 1.

14. A method for manufacturing a gate-all-around transistor comprising etching a structure containing silicon and silicon germanium by using the etching composition according to claim 1.

* * * * *